United States Patent
Poplevine et al.

(10) Patent No.: US 7,164,606 B1
(45) Date of Patent: Jan. 16, 2007

(54) REVERSE FOWLER-NORDHEIM TUNNELING PROGRAMMING FOR NON-VOLATILE MEMORY CELL

(75) Inventors: Pavel Poplevine, Foster City, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/182,115

(22) Filed: Jul. 15, 2005

(51) Int. Cl.
*G11C 16/12* (2006.01)
(52) U.S. Cl. .............. 365/185.28; 365/185.1; 365/185.14; 365/185.27; 365/185.02
(58) Field of Classification Search ........... 365/185.28, 365/185.02, 185.1, 185.14, 185.27, 185.05
See application file for complete search history.

(56) References Cited

U.S. PATENT DOCUMENTS

| | | | |
|---|---|---|---|
| 6,137,723 A | 10/2000 | Bergemont et al. | 365/185.18 |
| 6,903,978 B1 * | 6/2005 | Mirgorodski et al. | 365/185.28 |
| 6,992,927 B1 * | 1/2006 | Poplevine et al. | 365/185.05 |

* cited by examiner

*Primary Examiner*—Andrew Q. Tran
(74) *Attorney, Agent, or Firm*—Stallman & Pollock LLP

(57) ABSTRACT

In accordance with a method of programming an NVM array that includes 4-transistor PMOS non-volatile memory (NVM) cells having commonly connected floating gates, for all the cell's in the array that are to be programmed, all the electrodes of the cell are grounded. Then, an inhibiting voltage Vn is applied to the bulk-connected source region Vr of the cell's read transistor Pr, to the commonly connected drain, bulk and source regions Ve of the cell's erase transistor Pe, and to the drain region Dr of the read transistor Pr. The source region Vp and the drain region Dp of the cell's programming transistor Pw are grounded. The bulk Vnw of the programming transistor Pw is optional; it can be grounded or remain at the inhibiting voltage Vn. For all cells in the NVM array that are not selected for programming, the inhibiting voltage Vn is applied to Vr, Ve and Dr and is also applied to Vp, Dp and Vnw. The control gate voltage Vc of the cell's control transistor Pc is then swept from 0V to a maximum programming voltage Vcmax in a programming time Tprog. The control gate voltage Vc is then ramped down from the maximum programming voltage Vcmax to 0V. All electrodes of the cell and the inhibiting voltage Vn are then returned to ground.

2 Claims, 3 Drawing Sheets

REVERSE FOWLER-NORDHEIM TUNNELING PROGRAMMING FOR NON-VOLATILE MEMORY CELL

TECHNICAL FIELD

The present invention relates to integrated circuit memory devices and, in particular, to a low current programming method for a non-volatile memory (NVM) cell utilizing reverse Fowler-Nordheim tunneling.

DESCRIPTION OF THE INVENTION

Figure 1:
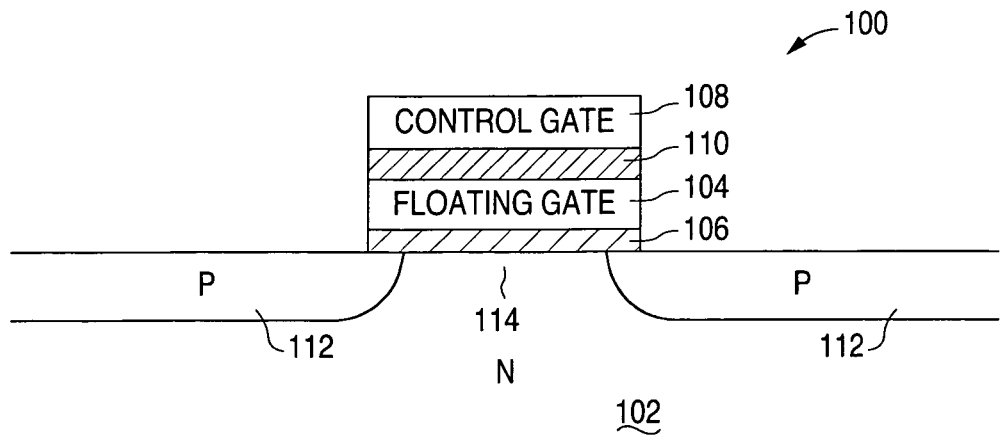
FIG. 1 is a partial cross section drawing illustrating a conventional P-channel insulated gate field effect transistor (P-IGFET) stacked gate non-volatile memory (NVM) cell.

FIG. 1 shows a conventional P-channel insulated gate field effect transistor (P-IGFET), e.g., a P-channel metal oxide semiconductor field effect transistor (P-MOSFET), stacked gate NVM cell 100 formed in an N-type region 102 of semiconductor material (e.g., a crystalline silicon substrate). As is well known, the N-type region 102 is typically an N-well formed in a P-type silicon substrate. The NVM cell 100 typically includes a polysilicon floating gate 104 that is separated from the N-type region 102 by a layer of thin "gate" silicon dioxide 106. A polysilicon control gate 108 is separated from the floating gate 104 by a layer of dielectric material 110, typically a sandwich of oxide-nitride-oxide (ONO). Two P-type diffusion regions 112 are formed in the N-type region 102 at the sides of the stacked gate structure to provide the source and drain regions of the NVM cell 100, defining an N-type channel region 114 between them. Integrated circuit fabrication techniques for making the NVM cell 100 are well known in the industry.

As is also well known, the conventional programming method for the NVM cell 100 uses hot electron injection. When applied to a stacked gate NVM cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative, but lower in absolute value as compared with the drain potential. Under these bias conditions, a high lateral electrical field is generated, thereby creating hot electronics that are affected by a high perpendicular electrical field such that the hot electrons tunnel through the thin gate oxide 106 to reach the floating gate 104. The amount of injection current depends primarily upon the potentials of the drain region and the floating gate electrode 104 such that, with more drain voltage, more injection takes place. Further discussion of the NVM cell 100 and its programming technique will be found in U.S. Pat. No. 6,137,723, issued Oct. 24, 2000, which is hereby incorporated herein by reference in its entirety to provide background information regarding the present invention.

Figure 2:
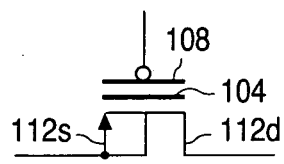
FIG. 2 is a schematic diagram of the FIG. 1 NVM cell.

FIG. 2 shows the NVM memory cell 100 of FIG. 1 in electrical schematic form, including a body-connected N-type source 112s and an N-type drain 1112d.

Co-pending and commonly-assigned U.S. patent application Ser. No. 10/895,710, titled "Improved Nonvolatile Memory Cell", filed by Pavel Poplevine et al. on Jul. 8, 2004, discloses an NVM memory cell 200, shown in FIG. 3, that includes four P-IGFETs connected to a common storage node Ns, with one P-IGFET transistor for each of the four cell functions: program (or write), read, erase and control. (application Ser. No. 10/895,710 is hereby incorporated by reference in its entirety.) The NVM cell 200, while being somewhat large in size or circuit area than the conventional stacked gate cell 100 described above, allows for independent and improved optimization of each cell function.

The programming function of the 4-transistor NVM cell 200 is controlled by a first programming transistor Pw having interconnected source and bulk regions to which a programming voltage Vp is applied. A programming signal Dp is applied to the drain of transistor Pw. The gate electrode of programming transistor Pw is connected to the common storage node Ns.

The read function of the NVM cell 200 is controlled by a second read transistor Pr having interconnected source and bulk regions to which a read voltage Vr is applied. The drain region of transistor Pr provides a read signal Dr. The gate electrode of read transistor Pr is connected to the common storage node Ns.

The erase function of the NVM cell 200 is controlled by a third erase transistor Pe having interconnected drain, source and bulk regions to which an erase voltage Ve is applied. The gate electrode of erase transistor Pe is connected to the common storage node Ns.

The control function of the NVM cell 200 is controlled by a fourth control transistor Pc having interconnected drain, source and bulk regions to which a control voltage Ve is applied. The gate electrode of control transistor Pc connected to the common storage node Ns.

The NVM cell 200 can be programmed in any of a number of ways including conventional techniques as follows. During programming, or writing, the programming voltage Vp (e.g., approximately 5 volts) is applied to programming transistor as described above, with all other electrodes of the cell 200 being connected to the circuit reference potential (e.g., ground). During an erase operation, an erase voltage Ve is applied (e.g., approximately 10 volts), with all other electrodes connected to the circuit reference potential. During reading, a read voltage Vr is applied (e.g., approximately 1 volt), and all other electrodes are connected to the circuit reference potential. (Such voltages are typical for oxide thicknesses in the range of 60–80 Angstroms.)

Figure 3:
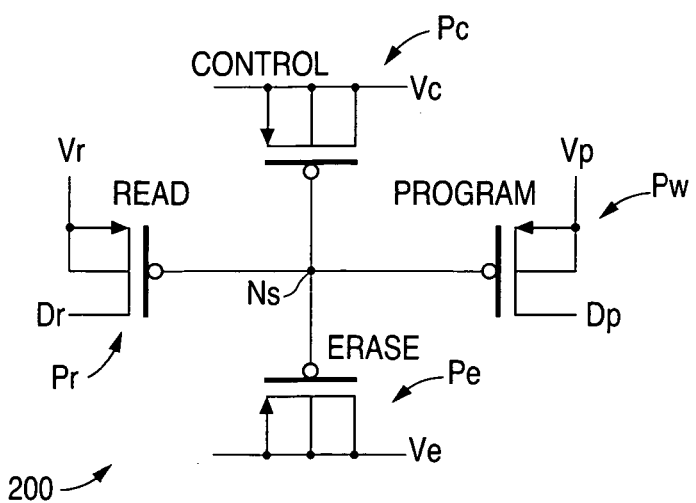
FIG. 3 is a schematic diagram illustrating a 4-transistor PMOS NVM cell.
Figure 4:
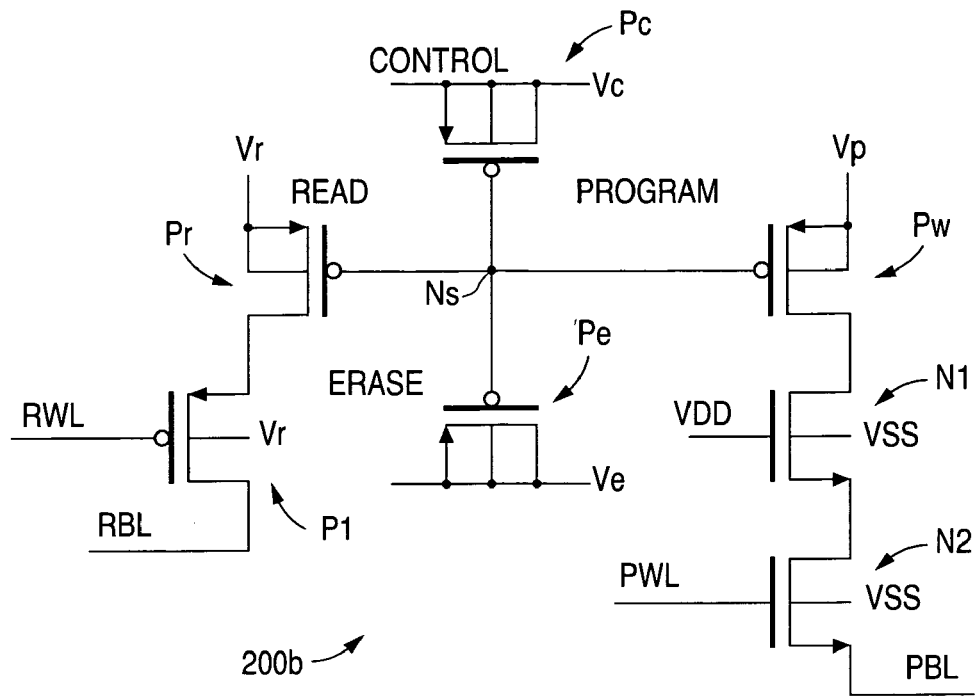
FIG. 4 is a schematic diagram illustrating the FIG. 3 NVM cell adapted for incorporation into an NVM cell array.

FIG. 4 shows the 4-transistor NVM cell 200 of FIG. 3 adapted to include additional transistors P1, N1, N2 for facilitating the use of the NVM cell 200 within an NVM cell array. For example, to read data from the common storage node Ns, P-channel pass transistor P1 is used. To program data to the storage node Ns, a cascade circuit that includes two N-channel pass transistors N1, N2 is used to prevent a high voltage from appearing between a gate electrode and a drain or source region.

Figure 5:
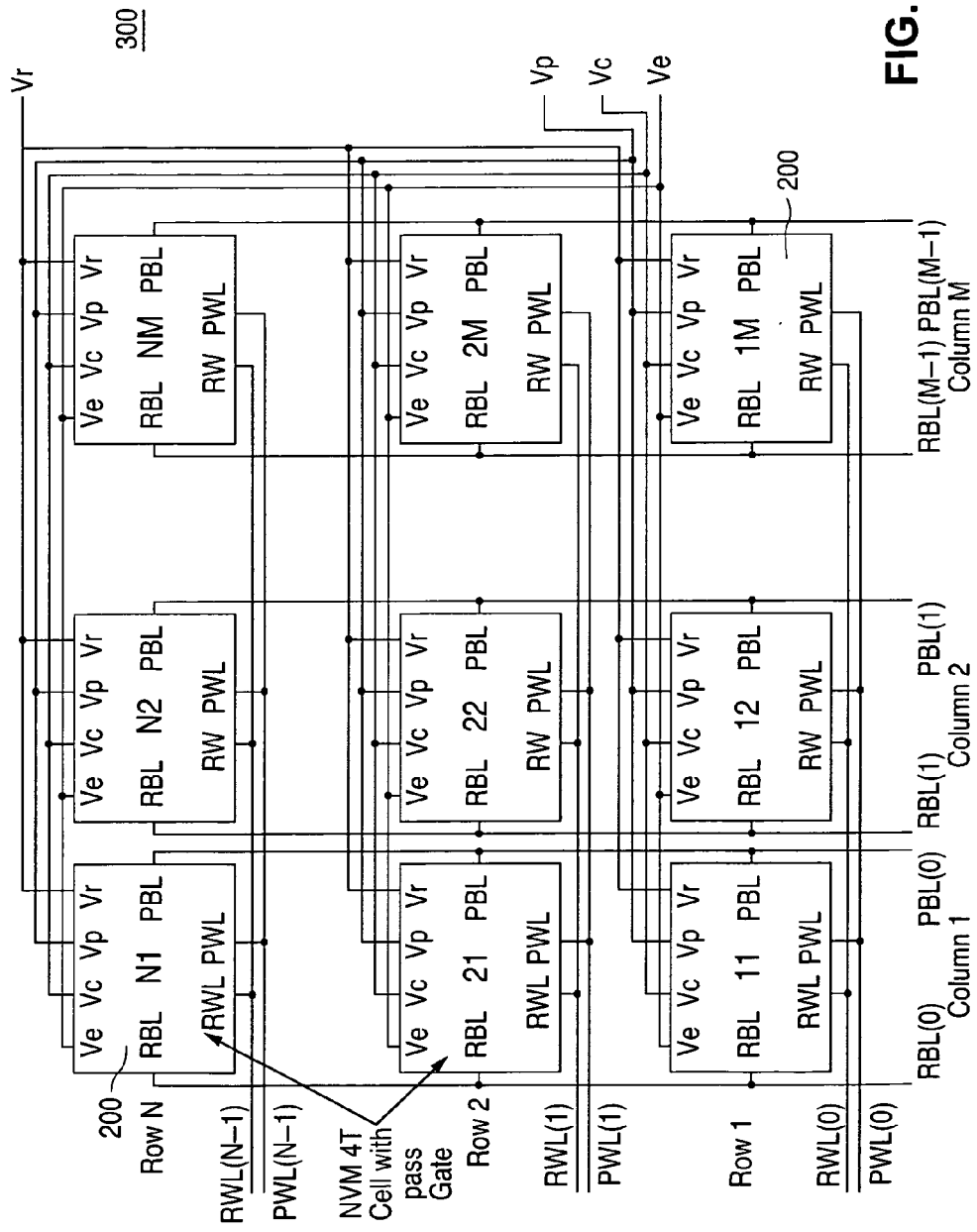
FIG. 5 is a block diagram illustrating an NVM cell array that includes a plurality of adapted NVM cells of the type shown in FIG. 4.

FIG. 5 shows a plurality of NVM memory cells 200, adapted as shown in FIG. 4, incorporated into an NVM cell array 300. The NVM cell array 300 includes M columns of adapted cells 200 and N rows of adapted cells 200. The program word line PWL is utilized to select the rows of the array 300 to be programmed, while the read word line RWL is utilized to select the rows of the array 300 to be read. The erase voltage Ve, the program voltage Vp, the control voltage Vc and the read voltage Vr are applied to each cell directly, as discussed above. With no high voltage switches or other supporting circuitry, significantly simplified connections can be made from the array 300 to external or internal voltage and signal sources and to the signal destinations.

The operational modes of erase, program and read for the array 300 are similar to those described above for a single NVM cell 200. During the erase mode, the program word lines PWL(0)–PWL(N−1) are at a logic low, the read word lines RWL(0)–RWL(N−1) are at a logic high, the erase voltage Ve is applied, and the rest of the signal lines are at circuit reference potential. This causes all cells in the array 300 to be erased.

During the programming mode, the read word lines RWL(0)–RWL(N−1) are at a logic high, one of the program word lines, e.g., PWL(0), will be at a logic high while the remaining program word lines, e.g., PWL(1)–PWL(N−1), will be at a logic low. To program a particular cell 200 in the array 300, the corresponding program bit line, e.g., PBL(0), will be at a logic low. To erase the remaining cells in the array 300, the corresponding program bit lines, e.g., PBL(1)–PBL(M−1), will be left floating. The program voltage Vp is applied to all cells in the array 300, while the remaining electrodes are at circuit reference potential.

During the read mode, the program word lines PWL(0)–PWL(N−1) are at a logic low, one of the read word lines, e.g., RWL(0), will be at a logic low, while the remaining read word lines, e.g., RWL)1)–RWL(N−1) will be at a logic high. On each of the read bit lines RBL(0)–RBL(M−1), a high current or voltage will be received for each corresponding cell in the array 300 that had been programmed, while a low current or voltage will be received for each corresponding cell that had been erased. The read voltage Vr is applied to all cells in the array 300, while the remaining electrodes are at circuit reference potential.

Different mechanisms and different program modes for the NVM cell 200 and for the array 300 are described in the following three co-pending and commonly-assigned U.S. patent applications: application Ser. No. 10/895,711, titled "Programming Method for Nonvolatile Memory Cell", filed by Pavel Poplevine et al. on Jul. 8, 2004; application Ser. No. 10/895,713, titled "Programming Method for Nonvolatile Memory Cell", filed by Pavel Poplevine et al. on Jul. 8, 2004; and application Ser. No. 10/895,712, titled "Programming Method for Nonvolatile Memory Cell", filed by Pavel Poplevine et al. on Jul. 8, 2004. (Each of these three applications is hereby incorporated by reference in its entirety.)

The primary difference between the programming methods disclosed in the four above-referenced Pavel Poplevine et al. applications and the programming method of the present invention is that the programming mode disclosed herein utilizes the reverse Fowler-Nordheim (FN) tunneling to program the above-described 4-transistor NVM cell 200 (FIG. 3). When the potential difference between floating gate and drain and source and body exceeds the tunneling threshold voltage ($V_{FN}$), electrons tunnel from drain and source to the gate. This makes the floating gate negatively charged.

Figure 6:
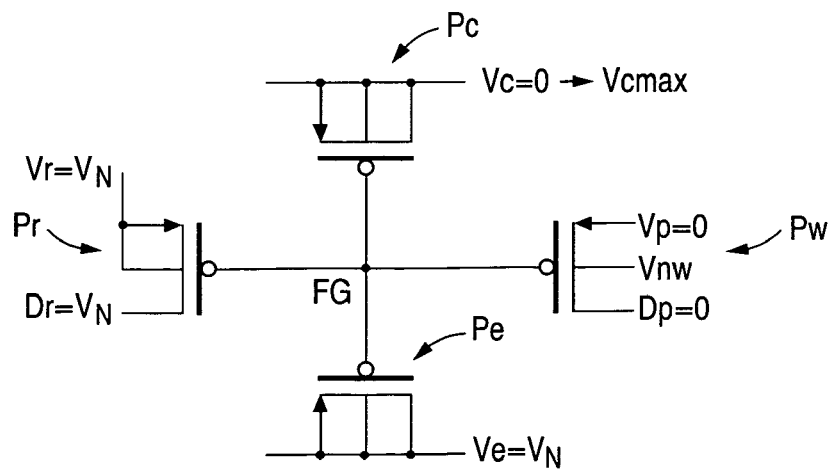
FIG. 6 is a schematic diagram illustrating the bias conditions for programming the FIG. 4 NVM cell in accordance with the concepts of the present invention.

The programming conditions for the NVM cell 200 in accordance with the present invention are shown in FIG. 6. The read voltage Vr applied to the bulk-connected source region of the read transistor Pr, the read signal Dr applied to the drain region of the read transistor Pr, and the erase voltage Ve applied to the interconnected drain, source and bulk regions of the erase transistor Pe are connected to voltage $V_N$. Voltage $V_N$ should be at a level high enough that prevent reverse Fowler-Nordheim tunneling, but low enough to ensure no forward tunneling. Voltage $V_N$ depends on gate oxide thickness; for example, $V_N$~3.3V for a gate oxide thickness of 70 Å. Setting the read voltage Vr, the read signal Dr and the erase voltage Ve to $V_N$ is done to prevent the read transistor Pr and the erase transistor Pe from being programmed. The programming voltage Vp and programming signal Dp of the program transistor Pw are both tied to 0V. The voltage Vnw on the bulk of programming transistor Pw can be tied to either 0v or to Vdd. The control gate voltage Vc on the control transistor Vc is then swept from 0V to a maximum voltage Vcmax in a preselected programming time Tprog. Tprog is in the range of tens of milliseconds. The programming time Tprog affects the amount of negative charge that will tunnel to the floating gate FG in FIG. 6.

The maximum control gate voltage Vcmax must exceed the tunneling threshold voltage $V_{FN}$; it affects the amount of negative charge to put on the floating gate FG. Voltage applied to floating gate Vc of control transistor Pc is coupled through control transistor Pc to the floating gate FG. When voltage at the floating gate FG reaches the tunneling threshold $V_{FN}$, then electrons tunnel from the drain/source/body of the program transistor Pw to the floating gate FG, making the floating gate FG more negative. The tunneling process continues as the control gate Vc is swept. At the end of the program cycle, the control gate voltage Vc is ramped back down to 0v. As a result of this process, the floating gate FG will be left with a net negative charge from the reverse Fowler-Nordheim tunneling programming regime.

There is no current consumption in the read transistor Pr, or the erase transistor Pe or the control transistor Pc during the programming process. The only current is the Fowler-Nordheim tunneling current, which is about 10 pA per transistor. Those skilled in the art will appreciate that this allows the use of a smaller charge pump.

NVM cells not selected to be programmed should be inhibited from being program. This is done by applying $V_N$ to all the electrodes (Vr, Dr, Ve, Dp, Vp and Vnw) of the unselected cells.

In summary, a programming sequence for the 4-transistor NVM cell shown in FIG. 6 proceeds as follows in accordance with the invention: All the electrodes of the cell are grounded. Next, for all selected cells that are to be programmed, an inhibiting voltage $V_N$ is applied to the bulk-connected source region Vr of read transistor Pr, to the commonly connected bulk, drain and source region Ve of erase transistor Pe, and to the drain region Dr of the read transistor Pr. The source region Vp and the drain region Dp of the programming transistor Pw are grounded. The bulk Vnw of the programming transistor Pw is optional—it can be grounded or remain at the inhibiting voltage $V_N$. For all unselected cells that are not be programmed, the inhibiting voltage $V_N$ is to applied to Vr, Ve and Dr. The inhibiting voltage $V_N$ is also applied to Vp, Dp and Vnw. The control gate Vc of control transistor Pc is then swept from 0v to the programming voltage maximum Vcmax in programming time Tprog. After programming time Tprog has elapsed, the control gate Vc is ramped down from Vcmax to 0v. Finally, all the electrodes of the cell are returned with the voltage $V_N$ to the ground.

Those skilled in the art will appreciate that the amount of negative charge trapped on the floating FG during the programming operation depends upon the maximum programming voltage Vcmax and the programming time Tprog. The higher the maximum programming voltage Vcmax and the longer the programming time Tprog, the more negative charge can tunnel to the floating gate FG.

The methods of erasing and the reading the 4-transistor cell remain the same as described in Poplevine et al. application Ser. No. 10/895,710. That is, for the erase condition: Ve±10V; all other electrodes grounded. For the read condition: Vr~1V; all other electrodes grounded.

The advantages of the NVM cell programming method in accordance with the present invention are very low current consumption and a simple program sequence. Low current consumption allows the possibility of programming a large number of cells at once without the need to create high current sourcing power sources.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of programming a non-volatile memory (NVM) cell, the memory cell including a first P-IGFET programming transistor having a source region, a bulk region, a drain region and a gate electrode connected to a common storage node, a second P-IGFET read transistor having interconnected source and bulk regions, a drain region and a gate electrode connected to the common storage node, a third P-IGFET erase transistor having interconnected drain, source and bulk regions and a gate electrode connected to the common storage node, and a fourth P-IGFET control transistor having interconnected drain, source and bulk regions and a gate electrode connected to the common storage node, the NVM cell programming method comprising:

grounding the source region, the drain and the gate electrode of each of the first, second, third and fourth P-IGFET transistors;

applying an inhibiting voltage to the interconnected source and bulk regions of the P-IGFET read transistor, the interconnected drain, source and bulk regions of the P-IGFET erase transistor and the drain region of the P-IGFET read transistor, while grounding the source region and the drain region of the P-IGFET programming transistor and maintaining the bulk region of the P-IGFET programming transistor at either ground or the inhibiting voltage;

sweeping the interconnected drain, source and bulk regions of the P-IGFET control transistor from 0V to a predefined maximum programming voltage in a preselected programming time; and at the end of the preselected programming time, ramping the interconnected drain, source and bulk regions of the P-IGFET control transistor from the predefined maximum programming voltage to 0V and returning all electrodes having the inhibiting voltage applied thereto to ground.

2. A method of programming a non-volatile memory (NVM) cell array that includes a plurality of NVM cells, each NVM cell in the array including a first P-IGFET programming transistor having a source region, a bulk region, a drain region and a gate electrode connected to a common storage node, a second P-IGFET read transistor having interconnected source and bulk regions, a drain region and a gate electrode connected to the common storage node, a third P-IGFET erase transistor having interconnected drain, source and bulk regions and a gate electrode connected to the common storage node, and a fourth P-IGFET control transistor having interconnected drain, source and bulk regions and gate electrode connected to the common storage node, the NVM cell array programming method comprising;

grounding the source region, the drain region and the gate electrode of each of the first, second, third and fourth P-IGFET transistor;

for all NVM cells in the NVM cell array selected for programming, applying an inhibiting voltage to the interconnected source and bulk regions of the P-IGFET read transistor, the interconnected drain, source and bulk regions of the P-IGFET erase transistor and the drain region of the P-IGFET read transistor, while grounding the source region and the drain region of the P-IGFET programming transistor and maintaining the bulk region of the P-IGFET programming transistor at either ground or the inhibiting voltage;

for all NVM cells in the NVM cell array not selected for programming, applying the inhibiting voltage to the source, bulk and drain regions of the P-IGFET read transistor, to the source, bulk and drain regions of the P-IGFET erase transistor and to the source, bulk and drain regions of the P-IGFET programming transistor;

sweeping the interconnected drain, source and bulk regions of the P-IGFET control transistors in the NVM cell array from 0v to a predefined maximum programming voltage in a preselected programming time; and at the end of the preselected programming time, ramping the interconnected drain, source and bulk regions of the P-IGFET control transistors in the NVM cell array from the predefined maximum programming voltage to 0V and returning all electrodes having the inhibiting voltage applied thereto to ground.

* * * * *